United States Patent
Wehlus et al.

(10) Patent No.: US 10,082,270 B2
(45) Date of Patent: Sep. 25, 2018

(54) OPTOELECTRONIC MODULE AND METHOD FOR PRODUCING AN OPTOELECTRONIC MODULE

(71) Applicant: OSRAM OLED GmbH, Regensburg (DE)

(72) Inventors: Thomas Wehlus, Lappersdorf (DE); Daniel Riedel, Regensburg (DE); Nina Riegel, Tegernheim (DE); Silke Scharner, Regensburg (DE); Johannes Rosenberger, Regensburg (DE); Arne Fleissner, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 3 days.

(21) Appl. No.: 15/513,570

(22) PCT Filed: Sep. 22, 2015

(86) PCT No.: PCT/EP2015/071713
§ 371 (c)(1),
(2) Date: Mar. 23, 2017

(87) PCT Pub. No.: WO2016/046198
PCT Pub. Date: Mar. 31, 2016

(65) Prior Publication Data
US 2017/0284628 A1    Oct. 5, 2017

(30) Foreign Application Priority Data
Sep. 23, 2014 (DE) .......... 10 2014 113 732

(51) Int. Cl.
*F21V 3/06* (2018.01)
*F21V 3/04* (2018.01)
(Continued)

(52) U.S. Cl.
CPC .............. *F21V 3/06* (2018.02); *F21V 3/0409* (2013.01); *F21V 15/01* (2013.01); *F21V 23/003* (2013.01);
(Continued)

(58) Field of Classification Search
CPC .......... F21V 3/06; F21V 3/0409; F21V 15/01; F21V 15/012; F21V 23/003; F21V 23/04; F21Y 2107/00; F21Y 2115/10
See application file for complete search history.

(56) References Cited

U.S. PATENT DOCUMENTS

| 5,500,635 A | 3/1996 | Mott |
| 6,704,004 B1 * | 3/2004 | Ostergård .............. H01H 13/83 178/18.11 |

(Continued)

FOREIGN PATENT DOCUMENTS

| AT | 505688 A1 | 3/2009 |
| DE | 10333040 A1 | 2/2005 |

(Continued)

OTHER PUBLICATIONS

International Search Report based on Application No. PCT/EP2015/071713 (2 pages + 2 pages English translation) dated Jan. 14, 2016.
(Continued)

*Primary Examiner* — Mary Ellen Bowman
(74) *Attorney, Agent, or Firm* — Viering Jentschura & Partner MBB

(57) ABSTRACT

A light-emitting module including a light-emitting component and a resilient body is provided. The light-emitting component includes a light-emitting layer structure for generating light and includes a light-emitting main face through which the generated light leaves the light-emitting component. The resilient body, which is arranged over the light-emitting main face, is connected firmly to the light-emitting
(Continued)

component, includes at least one light-deviating region, and includes a free-lying surface which includes at least one surface element, which lies at a distance greater than or equal to 4 mm from the light-emitting layer structure.

17 Claims, 4 Drawing Sheets

(51) Int. Cl.
    *F21V 15/01* (2006.01)
    *F21V 23/00* (2015.01)
    *F21V 23/04* (2006.01)
    *F21Y 115/10* (2016.01)
    *F21Y 107/00* (2016.01)

(52) U.S. Cl.
    CPC ........... *F21V 23/04* (2013.01); *F21Y 2107/00* (2016.08); *F21Y 2115/10* (2016.08)

(56) References Cited

U.S. PATENT DOCUMENTS

| | | | | |
|---|---|---|---|---|
| 2002/0145594 | A1* | 10/2002 | Derocher | ............ G06F 3/03547 345/173 |
| 2007/0201234 | A1 | 8/2007 | Ottermann | |
| 2012/0019128 | A1 | 1/2012 | Emde | |
| 2013/0044487 | A1 | 2/2013 | Burrows et al. | |
| 2014/0111855 | A1* | 4/2014 | Johnson | ............. G02B 27/2214 359/463 |

FOREIGN PATENT DOCUMENTS

| | | |
|---|---|---|
| DE | 102007060585 A1 | 6/2009 |
| DE | 102010002885 A1 | 9/2011 |
| DE | 102012109138 A1 | 3/2014 |
| EP | 2355144 A1 | 8/2011 |
| EP | 2768038 A2 | 8/2014 |
| JP | 2007220349 A | 8/2007 |
| WO | 2009033728 A2 | 3/2009 |

OTHER PUBLICATIONS

German Search Report based on Application No. 10 2014 113 732.9 (8 pages) dated Sep. 9, 2015.

* cited by examiner

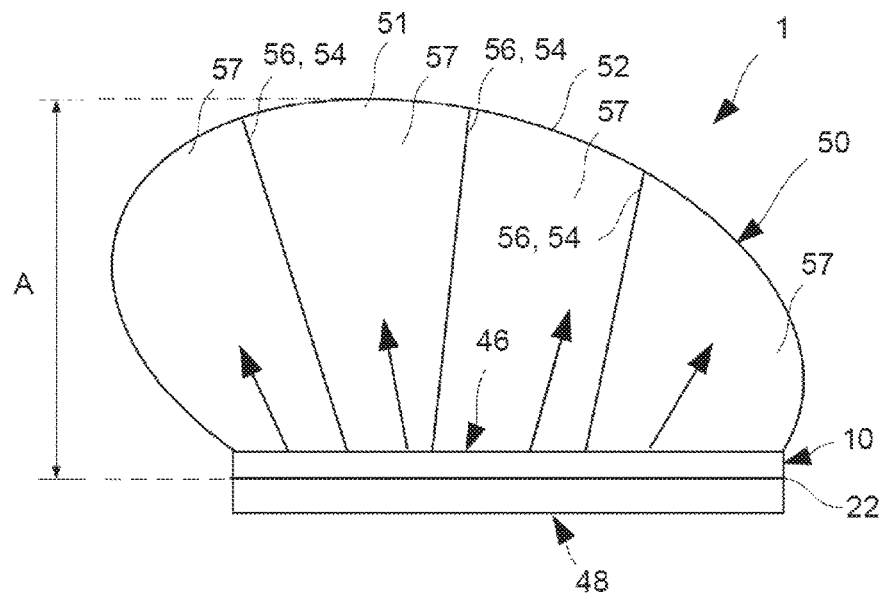
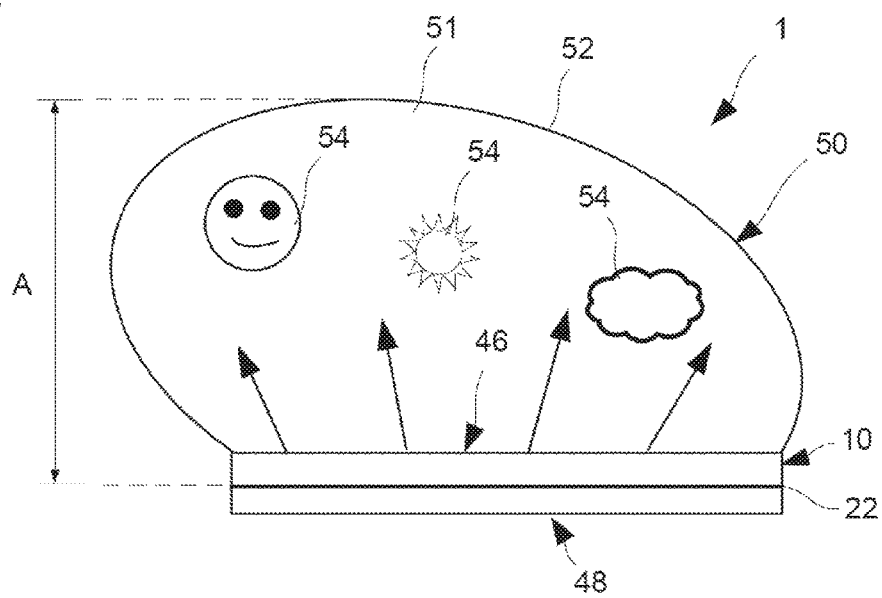

OPTOELECTRONIC MODULE AND METHOD FOR PRODUCING AN OPTOELECTRONIC MODULE

RELATED APPLICATIONS

The present application is a national stage entry according to 35 U.S.C. § 371 of PCT application No. PCT/EP2015/071713 filed on Sep. 22, 2015, which claims priority from German application No. 10 2014 113 732.9 filed on Sep. 23, 2014, and is incorporated herein by reference in its entirety.

TECHNICAL FIELD

The present disclosure relates to an optoelectronic module and to a method for producing an optoelectronic module.

BACKGROUND

Light-emitting components, in particular LEDs or organic light-emitting diodes (OLED), are being used increasingly widely for example for general lighting, for example as flat light sources, or as a representation device, for example in the form of displays or signaling devices.

An OLED, for example, may include an anode and a cathode and an organic functional layer system between them. The organic functional layer system may include one or more emitter layers, in which electromagnetic radiation is generated, a charge carrier pair generation layer structure respectively consisting of two or more charge carrier pair generation layers ("charge generating layer", CGL) for charge carrier pair generation, and one or more electron barrier layers, also referred to as hole transport layer(s) (HTL), and one or more hole barrier layers, also referred to as electron transport layer(s) (ETL), in order to direct the flow of current.

LEDs and OLEDs are at present practically available only in two-dimensional shape, so to speak in 2D, i.e. flat, for example as flat keyboards, or in sheet shape and flexible, so to speak in 2.5D. 2.5D refers to flat OLEDs consisting of flexible substrates, which up to a certain extent can be bent nondestructively, so that for example a curved OLED may be formed. OLEDs on arbitrarily shaped substrates with genuine 3D surfaces, and in particular 3D luminous faces, are to date substantially unknown. A 3D surface in the context of this application may, for example, have a non-constant curvature variation or two or more curvatures in at least two different spatial directions.

The basic problem in this case involves homogeneous deposition of the thin functional organic layers on nonplanar substrates. For high-power OLEDs, organic layer stacks are generally applied by physical vapor deposition. These are so-called line-of-sight methods, which allow homogeneous surface-wide coatings for flat (and possibly for moderately curved) substrates. For coating the surface of a complex 3D object, however, the existing methods are unsuitable since uncoated regions are left because of shadowing, and/or the coating becomes increasingly inhomogeneous.

Furthermore, for the function of an OLED it is important to apply the organic functional layers onto the substrate with an accurately defined thickness, since otherwise the performance of the OLED is not particularly good. In particular, undesired lateral layer thickness variations lead to undesired luminance gradients. Because of the different orientation of different surface regions of 3D substrates relative to the coating source, however, such layer thickness variations occur. Currently known methods are therefore not suitable for the production of OLEDs on 3D surfaces even when the above-explained case of shadowing of subregions is prevented.

As an alternative thereto, it is known to form 3D OLEDs by assembling a plurality of 2D OLEDs to form 3D bodies. For example, a cube may be formed from six square 2D OLEDs. In this case, however, non-luminous edge regions (the edges of the 2D OLEDs) remain at the edges of the 3D object, and only angular 3D bodies which can be assembled from planar surfaces are possible.

DE 10 2007 060 585 A1 discloses a 3D OLED which has a special shape, although the way in which the above-explained problems are solved, particularly in terms of deposition of the organic functional layers, is not shown.

It is an object of the present disclosure to provide a light-emitting module which has a three-dimensional luminous face, for example a complex three-dimensional luminous face, which has a mechanically flexible luminous face, for example an elastically deformable luminous face and/or can be produced simply and/or economically, for example with a low system complexity of a system for producing the optoelectronic module.

It is another object of the present disclosure to provide a method for producing a light-emitting module, which can be carried out simply and/or economically, for example with a low system complexity of a system for producing the optoelectronic module, and/or makes it possible for the optoelectronic module to have a three-dimensional luminous face, for example a complex three-dimensional luminous face, and/or a mechanically flexible luminous face, for example an elastically deformable luminous face.

SUMMARY

According to a first aspect, the object is achieved by a light-emitting module including a light-emitting component and a resilient body. The light-emitting component includes a light-emitting layer structure for generating light and a light-emitting main face through which the generated light leaves the light-emitting component. The resilient body is arranged over the light-emitting main face and is connected firmly to the light-emitting component. The resilient body includes at least one light-deviating region and a free-lying surface. The free-lying surface includes at least one surface element, which lies at a distance greater than or equal to 4 mm from the light-emitting layer structure.

Arranging the resilient body including the light-deviating region on the light-emitting main face of the light-emitting component can straightforwardly contribute to the provision of a light-emitting module having a 3D luminous face, i.e. a 3D light-emitting module. In particular, the light-emitting component may be produced simply and/or economically as a 2D component or as a 2.5D component, and the resilient body may in a simple and/or economical way be configured in virtually any desired 3D shape and arranged on the light-emitting component. The light-deviating region may be configured in such a way that it replicates the shape of the resilient body, or in such a way that it has a three-dimensional shape independent of the shape of the resilient body. For example, the light-deviating region may be formed on the surface of the resilient body and thus replicate the shape of the resilient body, and/or the light-deviating region may lie at a distance from the surface and thus be configured independently of the external shape of the resilient body. In both cases, the light-deviating region appears to an observer of the light-emitting module as a luminous face, in the case of a three-dimensional light-deviating region as a 3D luminous face. If the light-deviating region is formed on the surface of the resilient body, for example, then the impression is imparted that the deviated light is coming directly from the surface of the resilient body.

The light-emitting module has the three-dimensional luminous face which may be very complex and is mechanically flexible, in particular elastically deformable and can be produced simply and economically, in particular with a low system complexity of a system for producing the optoelectronic module.

The resilient body is, in particular, a three-dimensional resilient body. The fact that the body is resilient allows the 3D luminous face to be elastically deformable, in particular three-dimensionally deformable. The at least partially elastically deformable, i.e. flexible, 3D module including the light-emitting component and the resilient body may also be referred to, in correspondence with the flexible elastically deformable 2.5D OLED, as a 3.5D module, in particular as a 3.5D OLED. The fact that the resilient body is arranged on the light-emitting component may mean that it is applied thereon, i.e. initially formed and then applied thereon, or that it is formed thereon. The resilient body may, for example, include silicone or acrylate. These materials can straightforwardly be formed flexibly and three-dimensionally, and in virtually any desired 3D shape. Furthermore, one, two or more further resilient bodies of the light-emitting module may be arranged on the light-emitting component. In the case of a segmented OLED, for example, a resilient body may be assigned to each OLED segment, in particular arranged thereover, or the OLED segments are arranged in groups and a resilient body may be assigned to each group, in particular arranged thereover.

The light-deviating region may be fully or partially embedded in the resilient body and/or form an outer surface of the resilient body. For example, the resilient body may include a resilient base body and the light-deviating region, the light-deviating region being formed as a layer on the base body. In addition to the light-deviating region, one, two or more further light-deviating regions may be formed. The light-deviating region or regions form light sources in the resilient body during operation of the light-emitting modules, and this may for example be used to represent items of information. As an alternative or in addition, the light-deviating regions may be used to screen regions of the resilient body which no light generated by the light-emitting component is intended to enter. In other words, the light-deviating regions may be used for segmenting the resilient body into different light zones. In addition, one, two or more light-absorbing regions may also be provided, which may for example also be used to represent items of information and/or screen particular regions in the resilient body. If a plurality of resilient bodies are arranged on the light-emitting component, the light-deviating regions and/or the light-absorbing regions may be used to prevent light from one of the resilient bodies entering another of the resilient bodies. As an alternative or in addition, the light-deviating regions may also be arranged in such a way that regions in the resilient body are deliberately illuminated, for example regions which would otherwise be shadowed.

The fact that the resilient body includes at least one surface element on its surface, the distance of which from the light-emitting layer structure includes a distance greater than or equal to 4 mm, ensures that the resilient body can be deformed simply by means of a human finger, for example operated or depressed, for example in three spatial directions, and/or that there is sufficient area to represent one or more items of information. If the distance were smaller, there would no longer be precise operation or a sufficient display area to display items of information.

According to one refinement, the distance is greater than or equal to 1 cm, or greater than or equal to 2.5 cm, and less than 5 m, or less than 1 m, or less than 25 cm. If the distance is greater than or equal to 1 cm, this makes it possible that a well-defined and/or fine deformation of the resilient body can be carried out by means of a human finger, for example for precise entry of a control instruction, as will be explained in more detail below in connection with an operating element in the resilient body. If the distance is greater than or equal to 2.5 cm, this makes it possible that the resilient body can be deformed with an entire human hand, for example in a similar way to a computer mouse. If the resilient body is up to and/or less than 5 m, this makes it possible to illuminate a large region by means of the optoelectronic module, for example a large room, and/or to represent extensive graphics and/or items of information by means of the light-deviating region or regions. If the distance is up to and/or less than 1 m, this makes it possible for example to illuminate a normal to small region, for example a medium to small room, and to compactly represent graphics and/or items of information. For example, a luminous globe may be formed by the resilient body including the light-deviating region. If the distance is up to and/or less than 25 cm, this makes it possible to illuminate a small region, for example in the form of a room light, and/or compact items of information, for example with a low information content.

According to one refinement the light-emitting component includes a plurality of light-emitting layer structures, which are formed on single-piece carrier. The light-emitting layer structures may, for example, be formed laterally next to one another over the carrier. The light-emitting layer structures arranged laterally next to one another may also be referred to as a segmented light-emitting layer structure. For example, a segmented OLED and/or a display may be formed from the light-emitting layer structures arranged laterally next to one another. As an alternative or in addition to the light-emitting layer structures arranged laterally next to one another, one or both electrodes of the light-emitting component may be laterally segmented, so that a segmented OLED and/or a display may likewise be formed. Over the segmented OLED or the display, a plurality of resilient bodies, which can be illuminated independently of one another by means of the segmented OLED or the display, may be arranged laterally next to one another.

According to one refinement, an overall luminous area formed by the light-emitting layer structure or structures is greater than or equal to 1 $cm^2$. In particular, one, two or more organic light-emitting layer structures may provide a corresponding overall luminous area. This can contribute to the provision of a pleasant light source and/or to the representation of a display face or displaying items of information, for example with a low information content, and in particular to sufficient illumination of a resilient body corresponding thereto in size.

According to one refinement, an elastic modulus of the resilient body lies in a range of, for example, from 0.01 $kN/mm^2$ to 5.0 $kN/mm^2$, for example from 0.1 $kN/mm^2$ to 1.0 $kN/mm^2$. In other words, the fact that the body is resilient means that its elastic modulus lies in a range of, for example, from 0.01 $kN/mm^2$ to 5.0 $kN/mm^2$, for example from 0.1 $kN/mm^2$ to 1.0 $kN/mm^2$. In the case of silicone rubber as material for the resilient body, for example, the elastic modulus lies in a range of from 0.01 $kN/mm^2$ to 0.1 $kN/mm^2$, and in the case of acrylate as material in a range of from 2.7 to 3.2 $kN/mm^2$. The aforementioned elastic moduli can contribute to the resilient body on the one hand being simply and/or sufficiently deformable by means of a human finger or a human hand, and on the other hand having a sufficient geometrical stability if no external force is exerted on it.

According to one refinement, the free-lying surface of the resilient body is essentially not parallel to the light-emitting main face of the light-emitting component. This can contribute to complex luminous faces being formed by means of the resilient body and/or the surface and/or the light-deviating regions. For example, the surface may be configured in the shape of a sphere, in the shape of an egg or in the shape of a pyramid. The surface may be configured to be round, oval or polygonal in sectional representation. Furthermore, the resilient body and/or the surface may have a very complex shape and/or form for example a sculpture, a bust, a head, an animal, a building or a site of interest. By means of the light-deviating regions, a correspondingly complex luminous face can be formed.

According to one refinement, the light-deviating region includes a scattering region, a mirror region, a filter region and/or a conversion region. In other words the light deviation by means of the light-deviating region may take place because of scattering, reflection and/or conversion. In the case of conversion, the light generated by the light-emitting component is converted in terms of its wavelength. In other words, a color conversion of the generated light takes place during the conversion. The scattering region may, for example, be formed by light-scattering particles. In the case of each scattering, the corresponding incident light ray is deviated. The light-scattering particles may, for example, be $TiO_2$ particles. The mirror region may, for example, be made by a mirror face. In the case of each reflection, the corresponding incident light ray is deviated. The conversion region may, for example, be formed by converting materials, for example converter particles. The converter particles may also be used as scattering particles. During the conversion, the corresponding incident exciting light ray is generally deviated. By means of the conversion region or regions, light sources of different color can be formed in the resilient body, each converter particle being used as a corresponding light source. For example, the resilient body may include two or more segments will illuminate with different colors to one another. As an alternative or in addition, regions of different color may be generated by means of the filter region or regions, including for example without scattering, each filter element through which a light ray passes acting as a light source in the resilient body.

According to one refinement, the light-deviating region has a shape by means of which an item of information is represented. For example, the light-deviating region may be configured as a symbol, graphic, letter, numeral or image. In this way, simple items of information with a low information content can be represented. By means of a plurality of light-deviating regions, it is possible to represent correspondingly more complex items of information, for example words and/or sentences.

According to one refinement, the resilient body is transparent or translucent outside the light-deviating region. This makes it possible that the generated light can reach the light-deviating region without losses, or only with negligible losses, and/or that light incident from the outside can pass through the resilient body. For example, the resilient body may include a light-deviating region which, except for a small subregion of the surface, extends over the entire surface of the resilient body. Light which enters the resilient body through the small subregion can pass through the transparent or translucent resilient body and be detected by means of a photosensitive sensor. Optionally, the photosensitive sensor may be part of the light-emitting module, and/or be formed on the same carrier as the light-emitting layer structure.

According to one refinement, the light-emitting module includes an internal operating element, which is embedded in the resilient body and can be operated from the outside by a user indirectly via the resilient body. The internal operating element can be operated indirectly via the resilient body, particularly in the event of a deformation of the resilient body because of a force acting from the outside. The internal operating element may thus be embedded in the resilient body, and the light-deviating region or regions may be configured in such a way that the internal operating element is not visible from the outside. This makes it possible for an operator of the internal operating element to have the impression that the resilient body itself is the internal operating element.

According to one refinement, the internal operating element includes a push-button, a contact sensor, a control lever and/or a switch. This makes it possible to generate a signal by means of the light-emitting module and thus send an instruction to an electronic device, for example a computer and/or a processor. The push-button may be pressed by means of deformation of the resilient body. The contact sensor may be activated by means of deformation of the resilient body. The control lever may be moved by means of deformation of the resilient body. The control lever may, for example, be configured as a joystick and/or used as a joystick. If the control lever is not visible from the outside, then a user of the control lever has the impression that the three-dimensional resilient body is a type of joystick.

According to one refinement, as an alternative or in addition to the internal operating element, the light-emitting module includes an external operating element, which is arranged on the surface of the resilient body and can be operated from the outside by a user. For example, the external operating element may be configured as a contact-sensitive sensor, in particular as a touch sensor. This makes it possible to generate a signal by means of the light-emitting module and thus send an instruction to an electronic device, for example a computer and/or a processor.

According to one refinement, the light-emitting module includes an actuator, which is embedded in the resilient body and provides a user with a signal indirectly via the resilient body. This makes it possible also to provide an item of information transmitted by means of a movement of the resilient body, in addition to the generated and/or deviated light. In particular, a haptic signal may be transmitted to the user by means of the actuator. For example, feedback, in particular force feedback, to a user of the operating element may be carried out by means of the actuator. Application-specific feedback may furthermore be carried out. For example, a vibration may be generated by means of the actuator as an alarm or a warning signal, and transmitted by means of the resilient body to a finger or a hand of the user. The actuator may be integrated into the internal operating element or be independent thereof. For example, by means of an actuator integrated into the internal operating element, a resistance of the internal operating element against the effect of an external force may be adjusted. Furthermore, the actuator may be arranged in such a way, and/or the resilient body may be configured in such a way, that the actuator is not visible from the outside. The user who receives the haptic signal then has the impression that the signal is generated by the resilient body.

According to one refinement, the light-emitting component can be bent nondestructively. In other words, the light-emitting component is flexible. This makes it possible for the entire light-emitting module to be deformable and/or flexible. A complete 3.5D module is therefore provided. For example, the light-emitting component is a flexible OLED, i.e. a 2.5D OLED. The light-emitting module is then a flexible 3D OLED, i.e. a 3.5D OLED.

According to another aspect, the object is achieved by a method for producing a light-emitting module, for example the light-emitting module displayed above. In the method, the light-emitting component is provided, in particular formed. The light-emitting component is formed in such a way that it includes the light-emitting layer structure for generating light, and that it includes the light-emitting main face, through which the generated light leaves the light-emitting component. The resilient body is arranged over the light-emitting main face and is connected firmly to the light-emitting component. The resilient body includes at least the light-deviating region and the free-lying surface. The free-lying surface includes at least the surface element, which lies at the distance greater than or equal to 4 mm from the light-emitting layer structure.

The resilient body may initially be formed independently of the light-emitting component and then fastened firmly on the light-emitting component. The fastening may, for example, be carried out with a material fit or a form fit. In the case of material-fit connection, the resilient body may, for example, be adhesively bonded onto the light-emitting component. In the case of form-fit connection, the resilient body may, for example, include a latching means and be latched into a corresponding counter-latch on the light-emitting component, or the resilient body may include a spring or a groove and the light-emitting component may include a groove or a spring corresponding therewith, which are formed in such a way that the form-fit connection is produced when the spring is inserted into the groove.

As an alternative thereto, the resilient body may be produced, for example molded, on the light-emitting component, in which case the firm connection to the light-emitting component may be formed automatically during production. In particular, a material-fit connection may be formed in this case. For example, the material of the resilient body may be applied in the liquid and/or uncrosslinked state onto the light-emitting component in a mold, and dried, cured and/or crosslinked on the light-emitting component. The firm connection to the light-emitting component may then also be formed in this case.

The light-emitting component may be produced in a simple and/or known way. For example, a flat OLED, for example a 2D OLED or a 2.5D OLED may be produced in an evaporation process. In particular, such an OLED may be carried out by means of known layer deposition methods, evaporation processes, lithographic processes and/or printing processes.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which:

FIG. 3 shows a sectional representation of an embodiment of an optoelectronic module;

FIG. 4 shows a sectional representation of an embodiment of an optoelectronic module;

DETAILED DESCRIPTION

In the following detailed description, reference is made to the appended drawings, which form part of this description and in which specific embodiments, in which the present disclosure may be carried out, are shown for illustration. Since components of embodiments may be positioned in a number of different orientations, the direction terminology is used for illustration and is in no way restrictive. It is to be understood that other embodiments may be used and structural or logical variations may be carried out, without departing from the protective scope of the present disclosure. It is to be understood that the features of the various embodiments described herein may be combined with one another, unless otherwise specifically indicated. The following detailed description is therefore not to be interpreted in a restrictive sense, and the protective scope of the present disclosure is defined by the appended claims. In the figures, elements which are identical or similar are provided with identical references, if this is expedient.

A light-emitting module may include one, two or more light-emitting components. Optionally, a light-emitting module may also include one, two or more electronic components. An electronic component may, for example, include an active and/or a passive component. An active electronic component may for example include a computing, controlling and/or regulating unit, a sensor, an operating element, an actuator and/or a transistor. A passive electronic component may, for example, include a capacitor, a resistor, a diode or a coil.

A light-emitting component may be a light-emitting semiconductor component and/or be configured as a light-emitting diode (LED) or as an organic light-emitting diode (OLED), as a light-emitting transistor or as an organic light-emitting transistor. The light may, for example, be light in the visible range, UV light and/or infrared light. The light-emitting component may in various embodiments be part of an integrated circuit. Furthermore, a multiplicity of light-emitting components may be provided, for example fitted in a common housing.

Figure 1:
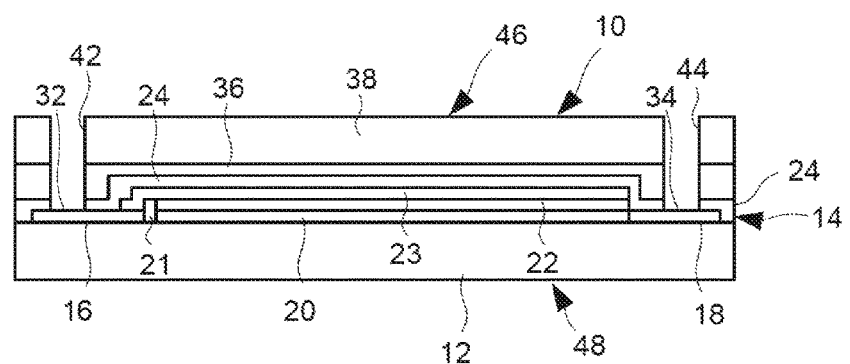
FIG. 1 shows a sectional representation of an embodiment of a light-emitting component.

FIG. 1 shows an embodiment of a light-emitting component 10. The light-emitting component 10 includes a carrier 12. The carrier 12 may be configured to be translucent or transparent. The carrier 12 is used as a carrier element for electronic elements or layers, for example light-emitting elements. The carrier 12 may for example include or be formed from plastic, metal, glass, quartz and/or a semiconductor material. Furthermore, the carrier 12 may include or be formed from a plastic film or a laminate including one or more plastic films. The carrier 12 may be configured to be mechanically rigid or mechanically flexible, i.e. nondestructively bendable. In particular, the light-emitting component 10 may be a flexible OLED.

The light-emitting component 10 shown in FIG. 1 is configured to be flat, i.e. two-dimensional, and may be referred to as a 2D OLED. If the light-emitting component 10 is flexible, then it may be referred to as a 2.5D OLED.

A functional layer structure is formed on the carrier 12. The functional layer structure includes a first electrode layer 14, which has a first contact section 16, a second contact section 18 and a first electrode 20. The carrier 12 including the first electrode layer 14 may also be referred to as a substrate. A first barrier layer (not represented), for example a first barrier thin film, may be formed between the carrier 12 and the first electrode layer 14.

The first electrode 20 is electrically insulated from the first contact section 16 by means of an electrical insulation barrier 21. The second contact section 18 is electrically coupled to the first electrode 20 of the functional layer structure. The first electrode 20 may be configured as an anode or as a cathode. The first electrode 20 may be configured to be translucent or transparent. The first electrode 20 includes an electrically conductive material, for example metal and/or a transparent conductive oxide (TCO) or a layer stack of a plurality of layers which include metals or TCOs. The first electrode 20 may, for example, include a layer stack of a combination of a layer of a metal on a layer of a TCO, or vice versa. One example is a silver layer which is applied on an indium tin oxide (ITO) layer (Ag on ITO), or ITO-Ag-ITO multilayers. As an alternative or in addition to the aforementioned materials, the first electrode 20 may include: networks of metal nanowires or nanoparticles, for example of Ag, networks of carbon nanotubes, graphite particles and layers and/or networks of semiconducting nanowires.

Formed over the first electrode 20, there is a light-emitting layer structure 22, for example an organic light-emitting layer structure, of the functional layer structure. The light-emitting layer structure 22 may for example include one, two or more sublayers. For example, the light-emitting layer structure 22 may include a hole injection layer, a hole transport layer, an emitter layer, an electron transport layer and/or an electron injection layer. The hole injection layer is used to reduce the bandgap between the first electrode 20 and the hole transport layer. In the hole transport layer, the hole conductivity is greater than the electron conductivity. The hole transport layer is used for transporting the holes. In the electron transport layer, the electron conductivity is greater than the hole conductivity. The electron transport layer is used for transporting the holes. The electron injection layer is used to reduce the bandgap between the second electrode 23 and the electron transport layer. Furthermore, the light-emitting layer structure 22 may include one, two or more light-emitting layer structure units, which respectively include the aforementioned sublayers and/or further intermediate layers. Formed over the light-emitting layer structure 22, there is a second electrode 23 of the functional layer structure, which is electrically coupled to the first contact section 16. The second electrode 23 may be formed according to one of the configurations of the first electrode 20, in which case the first electrode 20 and the second electrode 23 may be formed identically or differently. The first electrode 20 is used, for example, as an anode or cathode of the layer structure. In correspondence with the first electrode, the second electrode 23 is used as a cathode or anode of the functional layer structure.

The functional layer structure includes an electrically and/or optically active region. The active region is, for example, the region of the light-emitting component 10, in which electrical current for operation of the light-emitting component 10 flows and/or in which electromagnetic radiation is generated or absorbed. A getter structure (not represented) may be arranged on or over the active region. The getter layer may be configured to be translucent, transparent or opaque. The getter layer may include or be formed from a material which absorbs and finds substances that are harmful to the active region.

Formed over the second electrode 23 and partially over the first contact section 16 and partially over the second contact section 18, there is an encapsulation layer 24 which encapsulates the functional layer structure. The encapsulation layer 24 may be configured as a second barrier layer, for example as a second barrier thin film. The encapsulation layer 24 may also be referred to as thin-film encapsulation. The encapsulation layer 24 forms a barrier against chemical contaminants or atmospheric substances, in particular against water (moisture) and oxygen. The encapsulation layer 24 may be formed as a single layer, a layer stack or a layer structure. The encapsulation layer 24 may include or be formed from: aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, poly(p-phenylene terephthalamide), nylon 66, as well as mixtures and alloys thereof. Optionally, the first barrier layer may be formed on the carrier 12 in correspondence with one configuration of the encapsulation layer 24.

In the encapsulation layer 24, a first recess of the encapsulation layer 24 is formed over the first contact section 16 and a second recess of the encapsulation layer 24 is formed over the second contact section 18. A first contact region 32 is exposed in the first recess of the encapsulation layer 24, and a second contact region 34 is exposed in the second recess of the encapsulation layer 24. The first contact region 32 is used for electrical contacting of the first contact section 16, and the second contact region 34 is used for electrical contacting of the second contact section 18.

A bonding layer 36 is formed over the encapsulation layer 24. The bonding layer 36 includes for example a bonding agent, for example an adhesive, for example a laminating adhesive, a coating and/or a resin. The bonding layer 36 may, for example, include particles which scatter electromagnetic radiation, for example light-scattering particles.

A cover body 38 is formed over the bonding layer 36. The bonding layer 36 is used for fastening the cover body 38 on the encapsulation layer 24. The cover body 38 includes, for example, plastic, glass and/or metal. For example, the cover body 38 may be formed essentially from glass and include a thin metal layer, for example a metal foil, and/or a graphite layer, for example a graphite laminate, on the glass body. The cover body 38 is used to protect the light-emitting component 10, for example against the effects of mechanical force from the outside. Furthermore, the cover body 38 may be used to distribute and/or dissipate heat which is generated in the light-emitting component 10. For example, the glass of the cover body 38 may be used as protection against external influences, and the metal layer of the cover body 38 may be used to distribute and/or dissipate the heat given off during operation of the light-emitting component 10.

The light-emitting component 10 includes a first main face 46 and a second main face 48. The first main face 46 faces away from the second main face 48. The light-emitting component 10 emits the light essentially through the first and/or the second main face 46, 48. If the light is essentially emitted via the first main face 46, then the light-emitting component 10 may for example be referred to as a top emitter. If the light is essentially emitted via the second main face 48, then the light-emitting component 10 may for example be referred to as a bottom emitter. If the light is essentially emitted via the first and second main face 48, then the light-emitting component 10 may for example be referred to as a bilaterally emitting light-emitting diode or OLED, or as a transparent OLED.

As an alternative, the light-emitting component 10 may be laterally segmented and include individual light-emitting segments. Each light-emitting segment may be understood as an OLED unit. In particular, the light-emitting layer structure 22 and/or one or both electrodes 20, 23 may be laterally segmented. In other words, a plurality of small light-emitting layer structures 22, for example organic units separated from one another, or a plurality of small electrodes 20, 23, i.e. electrode units separated from one another, may be formed laterally next to one another over the one-piece carrier 12. The segments of the light-emitting component 10 may be driven and/or supplied with energy together or independently of one another. The segmented light-emitting component 10 may, for example, be configured as a representation device, for example as a display.

An overall luminous area formed by the light-emitting layer structure or structures 22 may be greater than or equal to 1 cm$^2$. In particular, one, two or more organic light-emitting layer structures 22 may provide a corresponding overall luminous area.

Figure 2:
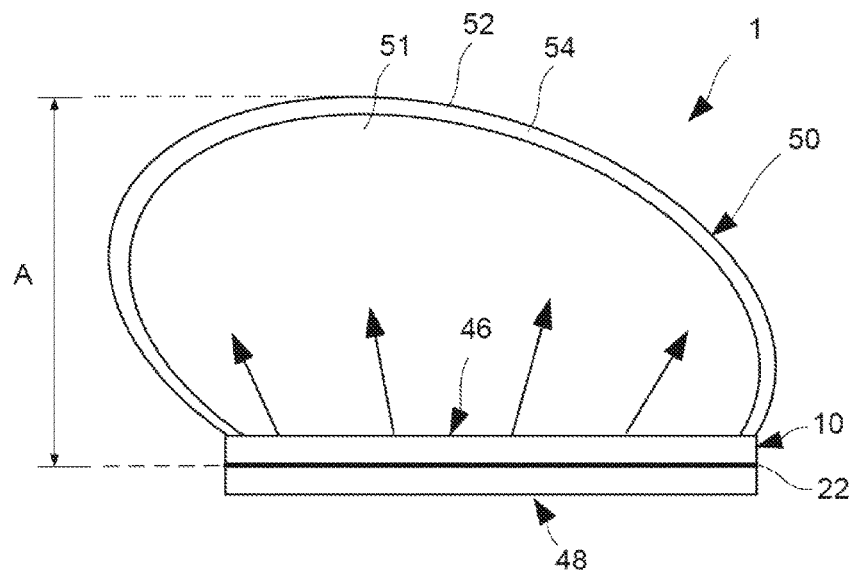
FIG. 2 shows a sectional representation of an embodiment of an optoelectronic module.

FIG. 2 shows an embodiment of a light-emitting module 1, which includes a light-emitting component, for example the light-emitting component 10 explained above, and a resilient body 50.

The resilient body 50 is arranged on that side of the light-emitting component 10 on which the light generated by the light-emitting component 10 is essentially emitted. In particular, the light-emitting component 10 emits the generated light essentially through the first main face 46 and the resilient body 50 is arranged on the first main face 46. As an alternative or in addition, the resilient body 50, or a further resilient body 50 (not represented), may be arranged on the second main face 48, for example if the light-emitting component 10 is a bottom emitter or a bilaterally emitting light-emitting diode, or OLED.

The resilient body 50 has an outer surface 52. The resilient body 50, and in particular the outer surface 52, extend in the three spatial directions, are not configured to be flat and/or not fully parallel to a plane, and are therefore configured three-dimensionally. The outer surface 50 has a first curvature, lying in the plane of the drawing in FIG. 2, and at least a second curvature (not visible in FIG. 2) lying perpendicularly to the plane of the drawing, in which case the first and second curvature may be equal or different in magnitude. The outer surface 50 is exposed, and is freely accessible from the outside. At least one surface element of the surface 52, i.e. at least an arbitrarily small subregion of the surface 52, lies at a distance A from the light-emitting layer structure 22, the distance A being greater than or equal to 4 mm, greater than or equal to 1 cm, or greater than or equal to 2.5 cm, and less than 5 m, or less than 1 m, or less than 25 cm. The resilient body 50 includes silicone or consists essentially of silicone. An elastic modulus of the resilient body 50 lies in a range of from 0.01 kN/mm$^2$ to 5.0 kN/mm$^2$, for example from 0.1 kN/mm$^2$ to 1.0 kN/mm$^2$.

The resilient body 50 includes a base body 51 and a light-deviating region 54. The light-deviating region 54 is formed close to the surface 52, in particular as a layer on the base body 51. The light-deviating region 54 forms the outer surface 52 of the resilient body 50. As an alternative thereto, the light-deviating region 54 may be fully or partially embedded in the base body 51, which then itself forms the outer surface 52. Except for the light-deviating region 54, the resilient body 50 may be configured to be essentially transparent or translucent. The light-deviating region 54 is formed by a scattering layer. The scattering layer extends over and/or along the entire surface 52 of the resilient body 50. The scattering layer may be formed by a multiplicity of scattering particles, by a surface structure of the surface 52, for example a roughness, and/or an internal structure placed close to the surface, for example internal engraving. The scattering particles may, for example include or be TiO$_2$.

The light-deviating region 54 is used for deviating the light which is generated by means of light-emitting component 10. Each light-deviating subelement of the light-deviating region 54 is externally perceived as a light source during operation of the light-emitting module 1. From the outside, there is therefore the optical impression that the light-deviating region 54, and therefore the surface 52 of the resilient body 50, is shining. The light-deviating region 54 forms a three-dimensional luminous face.

The light-emitting module 1 including the three-dimensional resilient body 50 may be referred to as a three-dimensional light-emitting module 1, for example as a 3D OLED. Since the resilient body 50 is readily elastically deformable, the light-emitting module 1 may also be referred to as a 3.5D OLED.

The resilient body 50 may have an external shape that differs from the external shape shown in FIG. 2. For example, the surface 52 may be configured in the shape of a sphere, in the shape of an egg or in the shape of a pyramid. The surface 52 may be configured to be round, oval or polygonal in sectional representation. Furthermore, the resilient body 50 and/or the surface 52 may have a very complex shape and/or form for example a sculpture, a bust, an animal, a building, a site of interest or a three-dimensional portrait, or a head. The light-deviating region 54 may correspondingly be adapted to the external shape of the resilient body 50, or may have a shape independent of the external shape of the resilient body 50. A three-dimensional luminous face, which may be configured in correspondence with the aforementioned shapes of the resilient body 50, is therefore formed by means of the resilient body 50 and the light-deviating region 54. Furthermore, this three-dimensional luminous face is elastically deformable by the effect of an external force, for example by means of mechanical pressure. Furthermore, the resilient body 50 may, in particular, include or essentially be formed from silicone rubber, and/or the resilient body 50 may include or be formed from acrylate.

The light-deviating region 54 may extend only over a part of the surface 52. Furthermore, the light-deviating region 54 may include a plurality of continuous or discontinuous subregions, which are formed overall or in part close to the surface 52 and/or far from the surface 52. For example, the light-deviating region 52, or a corresponding subregion far from the surface 50, may form a scattering layer and therefore a luminous face in the resilient body 50. Such an internally lying light-deviating region 52 may in turn have almost any desired shape, in particular those mentioned.

FIG. 3 shows an embodiment of a light-emitting module 1, which may substantially correspond to the light-emitting module 1 explained above. The light-emitting module 1 includes separating faces 56 in the resilient body 50.

The separating faces 56 are formed by interfaces of different body segments 57 of the resilient body 50. The body segments 57 are configured in such a way that the resilient body 50 imparts a respectively different optical impression in two different ones of the body segments 57. For example, the body segments 57 may have different transmission properties, and/or the body segments 57 may have different colors. The transmission properties may, for example, be adjusted by means of the choice of the material of the resilient body 50 and/or the choice or proportion of filler material of the resilient body 50. For example, scattering particles may be embedded in one of the body segments 57, so that the corresponding body segment 57 appears translucent, and no scattering particles may be embedded in another of the body segments 57, so that the corresponding body segment 57 appears transparent. As an alternative or in addition, the material in one of the body segments 57 may have a different refractive index than the material in another of the body segments 57. The refractive index may, for example, be adjusted by means of the choice of the base material 51, for example of the carrier material or of the matrix material, of the resilient body 50, and/or by means of the choice and/or the proportion of the filler material. The different colors may, for example, be adjusted by means of correspondingly different converter materials. For example, converter particles emitting red light may be embedded in one of the body segments 57 and converter particles emitting green light may be embedded in another of the body segments 57. As an alternative thereto, the colors may be adjusted by means of filter structures which are formed by the resilient body 50 or are embedded therein.

The separating faces 56 may optionally include or be formed from light-deviating regions 54, for example scattering regions and/or mirror regions. As an alternative or in addition, the separating faces 56 may include light-absorbing regions and/or particles which prevent light from one of the body segments 57 entering another of the body segments 57. As an alternative or in addition, the separating faces 56 may include or be formed by mirror regions. Optionally, the mirror regions reflect light which enters the resilient body 50 from the outside, or light which is generated by the light-emitting component 10. As an alternative or in addition, the separating faces 56 may be formed by converter particles. In various embodiments, the separating faces 56 may therefore themselves be configured as light-deviating regions 54 and/or be referred to as light-deviating regions 54.

The separating faces 56 may be formed as an alternative or in addition to the light-deviating regions 54.

FIG. 4 shows an embodiment of a light-emitting module 1, which may for example correspond substantially to one of the light-emitting modules 1 mentioned above. The light-emitting module 1 includes light-deviating regions 54, which are formed in the resilient body 50 and/or on the surface 52. The light-deviating regions 54 are configured in such a way that they represent items of information. The light-deviating regions 54 are configured as symbols. The light-deviating regions 54 are configured as a smiley, as the sun or as a cloud. The light-deviating regions 54 are configured three-dimensionally.

During operation of the light-emitting module 1, the light-deviating regions 54 deviate the light generated by the light-emitting component 10 in such a way that an observer receives the impression from the light-emitting module 1 that the light-deviating regions 54, and in particular the three-dimensional symbols represented thereby, are themselves shining.

As an alternative or in addition, light-deviating regions 54 which form numbers, numerals, letters, graphics, images, words, sentences or other items of information, may be formed in or on the resilient body 50. Furthermore, more or fewer or other symbols than as shown in FIG. 4 may be represented by means of the light-deviating regions 54.

The light-deviating regions 54 are formed as an alternative or in addition to the separating faces 56 and/or to the light-deviating regions 54. For example, one, two or more information elements formed by light-deviating regions 54, for example one or more symbols, may respectively be formed in a body segment 57.

Figure 5:
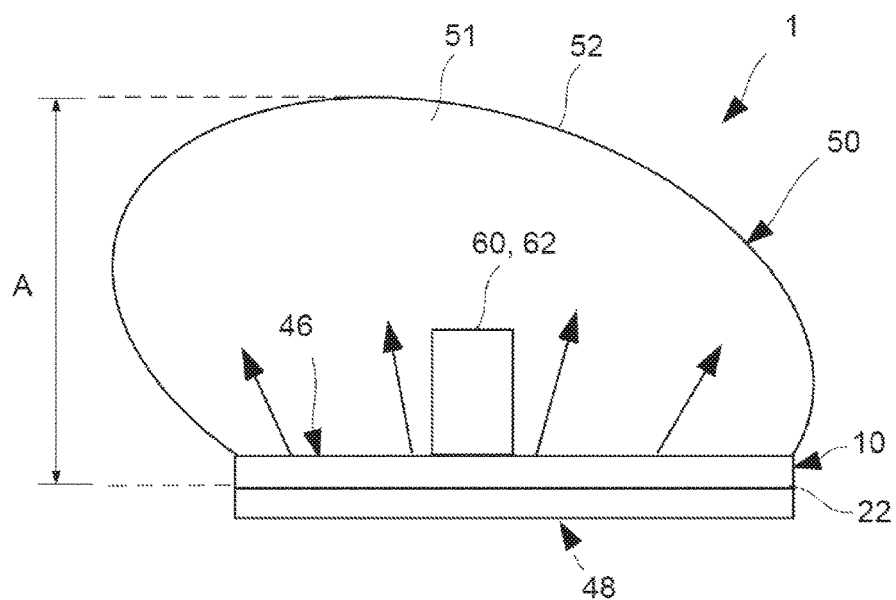
FIG. 5 shows a sectional representation of an embodiment of an optoelectronic module.

FIG. 5 shows an embodiment of a light-emitting module 1, which may for example correspond substantially to one of the light-emitting modules 1 mentioned above. The light-emitting module 1 includes an internal operating element 60 and/or an actuator 62. The internal operating element 60 or the actuator 62 is physically connected securely to the light-emitting component 10 and embedded in the resilient body 50. The internal operating element 60 and/or the actuator 62 may optionally be embedded in the resilient body 50 in such a way, and the light-deviating region or regions 54 may be configured in such a way, that the internal operating element 60 is not visible from the outside.

The internal operating element 60 can be operated, for example pressed, tilted, displaced or deformed, from the outside indirectly via the resilient body 50. The internal operating element 60 is electrically coupled to an electronic computing unit (not represented), for example a computer or a processor. In response to the operation of the internal operating element 60, the internal operating element 60 generates an electrical signal, which is sent to the electronic computing unit or interrogated by the electronic computing unit.

The internal operating element 60 is configured as a control lever. The control lever 60 can be moved by means of deformation of the resilient body 50. The control lever may, for example, be configured as a joystick and/or used as a joystick. If the control lever is not visible from the outside, then the user, in particular a user of the control lever, has the impression that the three-dimensional resilient body 50 is a joystick and/or is used thereas.

As an alternative or in addition, the internal operating element 60 may include a push-button, a contact sensor and/or a switch. Optionally, the push-button may be pressed by means of deformation of the resilient body 50. Optionally, the contact sensor may be activated by means of deformation of the resilient body. For example, the internal operating element 60 may be configured as a joystick including a push-button and/or a switch.

During its operation, the actuator 62 provides a signal indirectly via the resilient body 50 to the operator, for example a user. The actuator 62 may be coupled to an electronic computing unit (not represented), for example a computer or a processor. The signal is, in particular, a haptic signal. The haptic signal may for example be haptic feedback, in particular force feedback, to an operator of the internal operating element 60. As an alternative or in addition, the haptic signal may be application-specific feedback. For example, a vibration may be generated by means of the actuator as an alarm or a warning signal by the electronic device on which an application, for example a computer program, is active, and transmitted by means of the resilient body 50 to a finger or a hand of the user.

The actuator 62 may optionally be integrated into the internal operating element 60 or be independent thereof. For example, a resistance of the internal operating element 60 against the effect of an external force for operation of the operating element 60 may be adjusted by means of the actuator 62 integrated into the internal operating element 60.

The internal operating element 60 and/or the actuator 62 may be formed as an alternative or in addition to the first light-deviating regions 54 and/or the separating faces 56.

Figure 6:
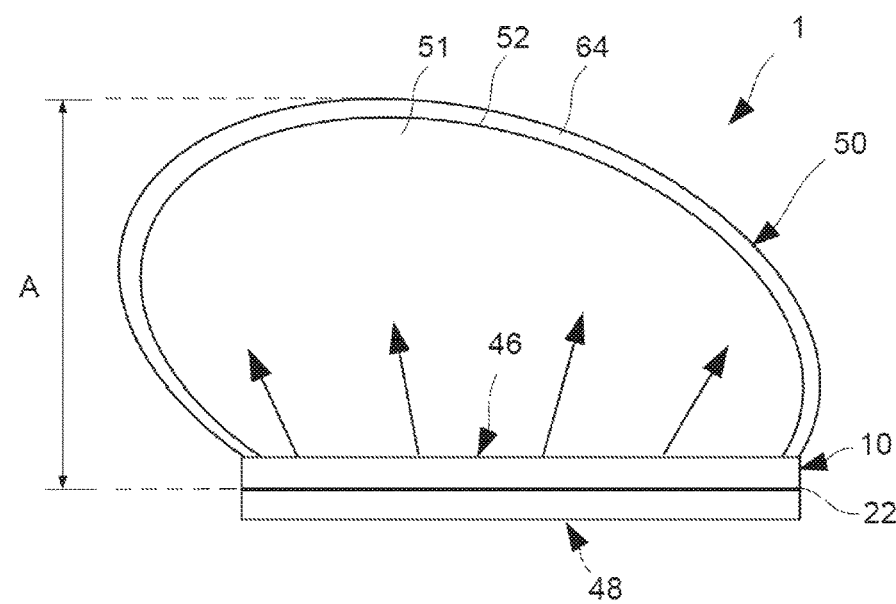
FIG. 6 shows a sectional representation of an embodiment of an optoelectronic module.

FIG. 6 shows an embodiment of a light-emitting module 1, which may for example correspond substantially to one of the light-emitting modules 1 mentioned above. The light-emitting module 1 includes an external operating element 64. The external operating element 64 is physically connected securely to the light-emitting component 10 and arranged on the surface 52, or embedded in the resilient body 50 close to the surface 52. The external operating element 64 may optionally be embedded in the resilient body 50 in such a way, and the light-deviating region or regions 54 may be configured in such a way, that the external operating element 64 is not visible from the outside. For example, the external operating element 64 may be fully covered by a light-deviating region 54, which is for example formed close to the surface 52 or on the surface 52.

The external operating element 64 is configured as a contact-sensitive sensor, for example as a touch sensor. The external operating element 64 can be operated, for example touched, pressed, tilted, displaced or deformed, from the outside directly or indirectly via the resilient body 50. The external operating element 64 is electrically coupled to an electronic computing unit (not represented), for example a computer or a processor. In response to the operation, in particular touching, of the external operating element 64, the external operating element 64 generates an electrical signal, which is sent to the electronic computing unit or interrogated by the electronic computing unit.

The external operating element 64 may be formed as an alternative or in addition to the internal operating element 60, the actuator 62, the light-deviating region 54 and/or the separating faces 56.

Figure 7:
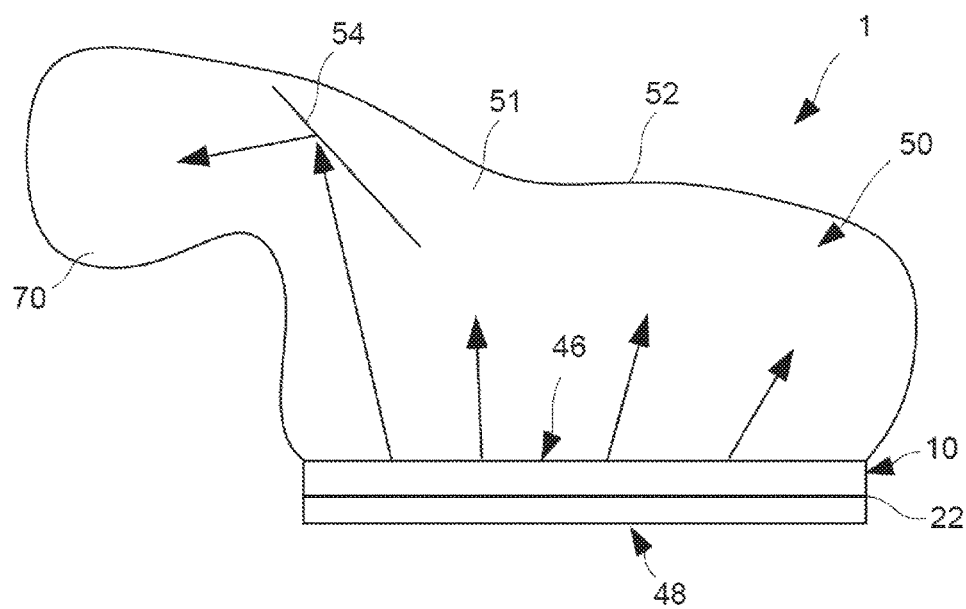
FIG. 7 shows a sectional representation of an embodiment of an optoelectronic module.

FIG. 7 shows an embodiment of a light-emitting module 1, which may for example correspond substantially to one of the light-emitting modules 1 mentioned above. The resilient body 50 has a three-dimensional shape, which includes a shadowed region 70 which no light generated by the light-emitting component 10 reaches on a direct path. A first light-deviating region 54 is embedded in the resilient body 50 in such a way that it directs light from the light-emitting component 10 in the direction toward the shadowed region 70. If a further light-deviating region 54, 56, 58 is formed in the shadowed region 70, then, by virtue of the first light-deviating region 54 shown in FIG. 7, it may be used as a luminous face. This may, particularly in the case of very complex shapes of the resilient body 50, contribute to a uniform and/or homogeneous luminous face being generated.

Figure 8:
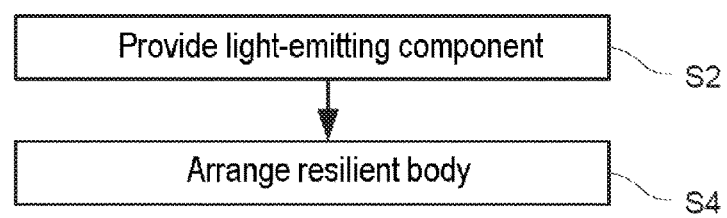
FIG. 8 shows a flowchart of an embodiment of a method for producing an optoelectronic module.

FIG. 8 shows a flowchart of a method for producing a light-emitting module 1, for example one of the aforementioned light-emitting modules 1.

In a step S2, the light-emitting component 10 is provided, in particular formed. The light-emitting component 10 is formed in such a way that it includes the light-emitting layer structure 22 for generating light, and that it includes the light-emitting main face 46, through which the generated light leaves the light-emitting component 10. The light-emitting component 10 may for example be produced as a flat OLED, for example as a 2D OLED or as a 2.5D OLED, i.e. as a flexible OLED, by means of known layer deposition methods, for example one or more evaporation processes, lithographic processes and/or printing processes. In particular, the first electrode 20, the light-emitting layer structure 22, the second electrode 23 and a cover, which includes for example the encapsulation layer 24 and/or the cover body 38, are formed over the carrier 12.

In a step S2, the resilient body 59 is arranged over the light-emitting first main face 46. The resilient body 50 includes at least the light-deviating region 54 and the free-lying surface 52. The free-lying surface 52 includes at least the surface element, which lies at the distance A greater than or equal to 4 mm from the light-emitting layer structure.

The resilient body 50 is initially formed independently of the light-emitting component 10 and then fastened firmly on the light-emitting component 10 and/or connected firmly to the light-emitting component 10. The fastening may, for example, be carried out with a material fit or a form fit. In the case of material-fit connection, the resilient body 50 is adhesively bonded onto the light-emitting component 10. In the case of form-fit connection, the resilient body 50 is formed so as to have a latching means, which is latched into a corresponding counter-latch on the light-emitting component 10, or the resilient body 50 is formed so as to have a spring or a groove and the light-emitting component 10 is formed with a groove or spring corresponding therewith, so that the spring can be inserted into the groove, so that the form-fit connection is produced.

As an alternative thereto, the resilient body 50 is produced, for example molded, on the light-emitting component 10. The firm connection to the light-emitting component 10 is formed automatically during production of the resilient body 50. In particular, a material-fit connection is formed in this case. For example, the material of the resilient body 50 may be introduced in the liquid and/or uncrosslinked state into a mould arranged over the light-emitting component 10, and dried, cured and/or crosslinked directly on the light-emitting component 10. The resilient body 50 and the firm connection to the light-emitting component 10 are in this case formed.

The present disclosure is not restricted to the embodiments indicated. For example, the resilient body 50 may have any three-dimensional shapes which can be produced by means of the corresponding material. Accordingly, the light-deviating region or regions 54 may have virtually any desired shape, so long as it can be produced in or on the base body 51 of the resilient body 50. The method may furthermore include intermediate steps (not shown); for example, one or more layers, for example optically functional layers, for example scattering layers, may be formed between the light-emitting component 10 and the resilient body. Furthermore, the light-emitting module 1 may include corresponding layers.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. A light-emitting module, comprising
   a light-emitting component, which comprises a light-emitting layer structure for generating light and comprises a light-emitting main face through which the generated light leaves the light-emitting component, and a resilient body, which is arranged over the light-emitting main face, is connected firmly to the light-emitting component, comprises at least one light-deviating region, and comprises a free-lying surface which comprises at least one surface element, which lies at a distance greater than or equal to 4 mm from the light-emitting layer structure.

2. The light-emitting module as claimed in claim 1, wherein the distance
is greater than or equal to 1 cm, or greater than or equal to 2.5 cm, and
less than 5 m, or less than 1 m, or less than 25 cm.

3. The light-emitting module as claimed in claim 1, wherein the light-emitting component comprises a plurality of light-emitting layer structures, which are formed on single-piece carrier.

4. The light-emitting module as claimed in claim 1, wherein an overall luminous area formed by the light-emitting layer structure or structures is greater than or equal to 1 cm$^2$.

5. The light-emitting module as claimed in claim 1, wherein an elastic modulus of the resilient body in the region is from 0.01 kN/mm$^2$ to 5.0 kN/mm$^2$.

6. The light-emitting module as claimed in claim 1, wherein the free-lying surface of the resilient body is essentially not parallel to the light-emitting main face of the light-emitting component.

7. The light-emitting module as claimed in claim 1, wherein the light-deviating region comprises a scattering region, a mirror region and/or a conversion region.

8. The light-emitting module as claimed in claim 1, wherein the light-deviating region has a shape by means of which an item of information is represented.

9. The light-emitting module as claimed in claim 1, wherein the resilient body is transparent or translucent outside the light-deviating region.

10. The light-emitting module as claimed in claim 9, further comprising an internal operating element, which is embedded in the resilient body and can be operated from the outside by a user indirectly via the resilient body.

11. The light-emitting module as claimed in claim 10, wherein the internal operating element comprises a push-button, a contact sensor, a control lever and/or a switch.

12. The light-emitting module as claimed in claim 9, further comprising an external operating element, which is arranged on the surface of the resilient body and can be operated from the outside by a user.

13. The light-emitting module as claimed in claim 1, further comprising an actuator, which is embedded in the resilient body and provides a user with a signal indirectly via the resilient body.

14. The light-emitting module as claimed in claim 1, wherein the light-emitting component can be bent nondestructively.

15. A method for producing a light-emitting component comprising,
providing a light-emitting component, which comprises a light-emitting layer structure for generating light and comprises a light-emitting main face through which the light leaves the light-emitting component
arranging a resilient body over the light-emitting main face and
connecting the resilient body firmly to the light-emitting component, the resilient body comprising at least one light-deviating region and a free-lying surface which comprises at least one surface element, which lies at a distance greater than or equal to 4 mm from the light-emitting layer structure.

16. 3D-OLED, comprising
an organic light-emitting component, which comprises a light-emitting layer structure for generating light and comprises a light-emitting main face through which the generated light leaves the organic light-emitting component, and
a resilient body, which is arranged on the light-emitting main face, which is cohesively bonded to the light-emitting main face and which comprises at least one exposed outer surface, which is formed by a light-deviating region and which comprises at least one surface element, which has a distance greater than or equal to 4 mm from the light-emitting layer structure,
wherein the resilient body and its exposed outer surface have a three-dimensional shape such that a three-dimensional luminous surface is formed by the resilient body and the light-deviating region at the exposed outer surface.

17. The light-emitting module as claimed in claim 1, wherein an elastic modulus of the resilient body in the region is from 0.1 kN/mm$^2$ to 1.0 kN/mm$^2$.

* * * * *